United States Patent
Amirkhany et al.

(10) Patent No.: US 9,432,227 B2
(45) Date of Patent: *Aug. 30, 2016

(54) PARTIAL RESPONSE DECISION FEEDBACK EQUALIZER WITH SELECTION CIRCUITRY HAVING HOLD STATE

(71) Applicant: Rambus Inc., Sunnyvale, CA (US)

(72) Inventors: Amir Amirkhany, Sunnyvale, CA (US); Kambiz Kaviani, Palo Alto, CA (US); Aliazam Abbasfar, San Diego, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/575,985

(22) Filed: Dec. 18, 2014

(65) Prior Publication Data

US 2015/0103876 A1 Apr. 16, 2015

Related U.S. Application Data

(63) Continuation of application No. 13/915,290, filed on Jun. 11, 2013, now Pat. No. 8,937,994.

(60) Provisional application No. 61/664,004, filed on Jun. 25, 2012.

(51) Int. Cl.
*H03K 5/159* (2006.01)
*H04L 25/03* (2006.01)
*H03K 5/24* (2006.01)

(52) U.S. Cl.
CPC ........... *H04L 25/03949* (2013.01); *H03K 5/24* (2013.01)

(58) Field of Classification Search
CPC ................ H04L 25/03949; H04L 2025/0349; H04L 2025/03617; H04L 25/03006; H04L 25/03057; H04L 25/03; H03K 5/24; H03H 2021/0098; H03G 5/165
USPC .......................... 375/233, 229, 230, 232, 316
See application file for complete search history.

(56) References Cited

U.S. PATENT DOCUMENTS

| | | |
|---|---|---|
| 5,778,217 A | 7/1998 | Kao |
| 6,002,730 A | 12/1999 | Kim et al. |
| 6,377,638 B1 | 4/2002 | Tamura et al. |

(Continued)

OTHER PUBLICATIONS

Pozzoni et al., "A Multi-Standard 1.5 to 10 Gb/s Latch-Based 3-Tap DFE Receiver With a SSC Tolerant CDR for Serial Backplane Communication," IEE Journal of Solid-State Circuits, vol. 44, No. 4, Apr. 2009, pp. 1306-1315. 10 pages.

*Primary Examiner* — Helene Tayong
(74) *Attorney, Agent, or Firm* — Lance M. Kreisman; Peninsula Patent Group

(57) ABSTRACT

A partial response decision feedback equalizer (PrDFE) includes a receiver including at least first and second comparators operative to compare an input signal representing a sequence of symbols against respective thresholds and to respectively generate first and second receiver outputs. A first selection stage is provided to select (a) between the first comparator output and a first resolved symbol according to a first timing signal, and (b) between the second comparator output and the first resolved symbol according to the first timing signal, to produce respective first and second selection outputs. A second selection stage selects between the first and second selection outputs according to a selection signal. The selection signal is dependent on a prior resolved symbol that precedes the first resolved symbol in the sequence.

20 Claims, 10 Drawing Sheets

(56) References Cited

U.S. PATENT DOCUMENTS

| | | |
|---|---|---|
| 7,308,048 B2 | 12/2007 | Wei |
| 7,412,016 B2 | 8/2008 | Stojanovic |
| 7,433,397 B2 | 10/2008 | Garlepp et al. |
| 7,715,474 B2 | 5/2010 | Park et al. |
| 7,792,187 B2 | 9/2010 | Bulzacchelli |
| 7,822,114 B2 | 10/2010 | Bulzacchelli et al. |
| 8,345,738 B2 | 1/2013 | Abbasfar |
| 8,711,922 B2 | 4/2014 | Shen et al. |
| 8,942,319 B2 * | 1/2015 | Thakkar et al. ............. 375/331 |
| 2005/0111585 A1 | 5/2005 | Stojanovic et al. |
| 2005/0195893 A1 | 9/2005 | Brunn et al. |
| 2009/0010320 A1 * | 1/2009 | Hollis ............... H03K 3/356113 375/232 |
| 2010/0054324 A1 | 3/2010 | Bulzacchelli et al. |
| 2010/0103999 A1 | 4/2010 | Leibowitz et al. |
| 2011/0018599 A1 * | 1/2011 | Abbasfar .......... H04L 25/03878 327/158 |
| 2011/0249774 A1 * | 10/2011 | Thakkar ........... H04L 25/03057 375/316 |
| 2013/0028313 A1 * | 1/2013 | Shen ................ H04L 25/03057 375/233 |
| 2013/0300481 A1 | 11/2013 | Bulzacchelli et al. |

* cited by examiner

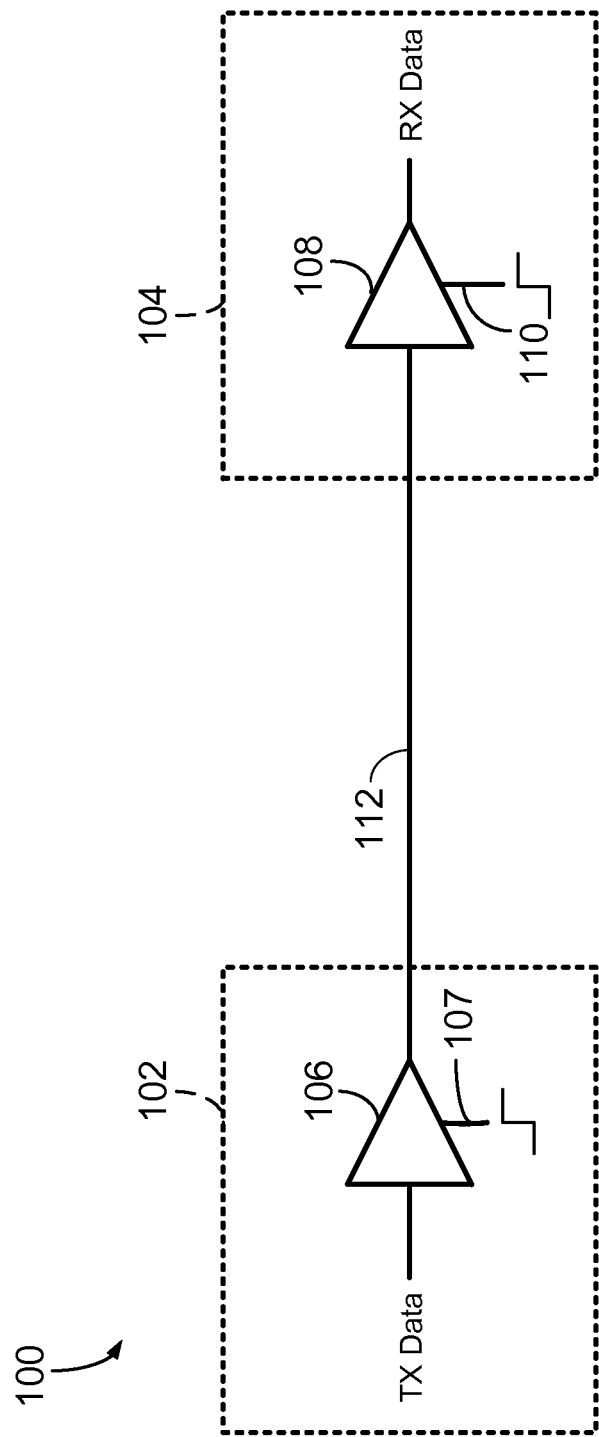

PARTIAL RESPONSE DECISION FEEDBACK EQUALIZER WITH SELECTION CIRCUITRY HAVING HOLD STATE

RELATED APPLICATIONS

This application is a Continuation of U.S. patent application Ser. No. 13/915,290, filed Jun. 11, 2013, entitled PARTIAL RESPONSE DECISION FEEDBACK EQUALIZER WITH SELECTION CIRCUITRY HAVING HOLD STATE, which claims the benefit of priority under 35 U.S.C. 119(e) to Provisional Application No. 61/664,004, filed Jun. 25, 2012, entitled PARTIAL RESPONSE DECISION FEEDBACK EQUALIZER WITH SELECTION CIRCUITRY HAVING HOLD STATE, both of which are incorporated herein by reference in their entirety for all purposes.

TECHNICAL FIELD

The disclosure herein relates to communication systems and methods and, more particularly, to high speed electronic signaling between integrated circuit devices.

BACKGROUND

Decision feedback equalization (DFE) is an important technique in addressing high-frequency attenuation caused by inter-symbol interference (ISI). Generally, at a receiver end of a chip-to-chip interface, the technique involves sampling input data, and compensating for expected ISI by adjusting the sampling based on previously received data values. Partial response methods (i.e., PrDFE) further improve basic DFE techniques by processing parallel decision paths for alternative selection for each sampled input symbol. The parallel paths provide a straightforward way to resolve data decisions using the most recent (least latent) data bits.

As signaling rates increase, feeding back the least latent data in time for use in the processing becomes problematic because of timing delays associated with the feedback path. Elaborating on these delays, the circuitry used to establish this feedback only operates so fast, and as signaling rates increase to the point where a bit timing interval becomes too fast for the circuitry to react, it becomes difficult to effectively utilize feedback representing the least latent prior data. Thus, industry has sought ways for reducing the critical timing paths associated with PrDFE, which would enable these equalizers to work with faster signaling rates.

BRIEF DESCRIPTION OF THE DRAWINGS

Embodiments of the disclosure are illustrated by way of example, and not by way of limitation, in the figures of the accompanying drawings and in which like reference numerals refer to similar elements.

FIG. 1A illustrates a system that includes a transmitter on a first integrated circuit that transmits signals through a signal path to a receiver on a second integrated circuit.

DETAILED DESCRIPTION

Figure 1B:
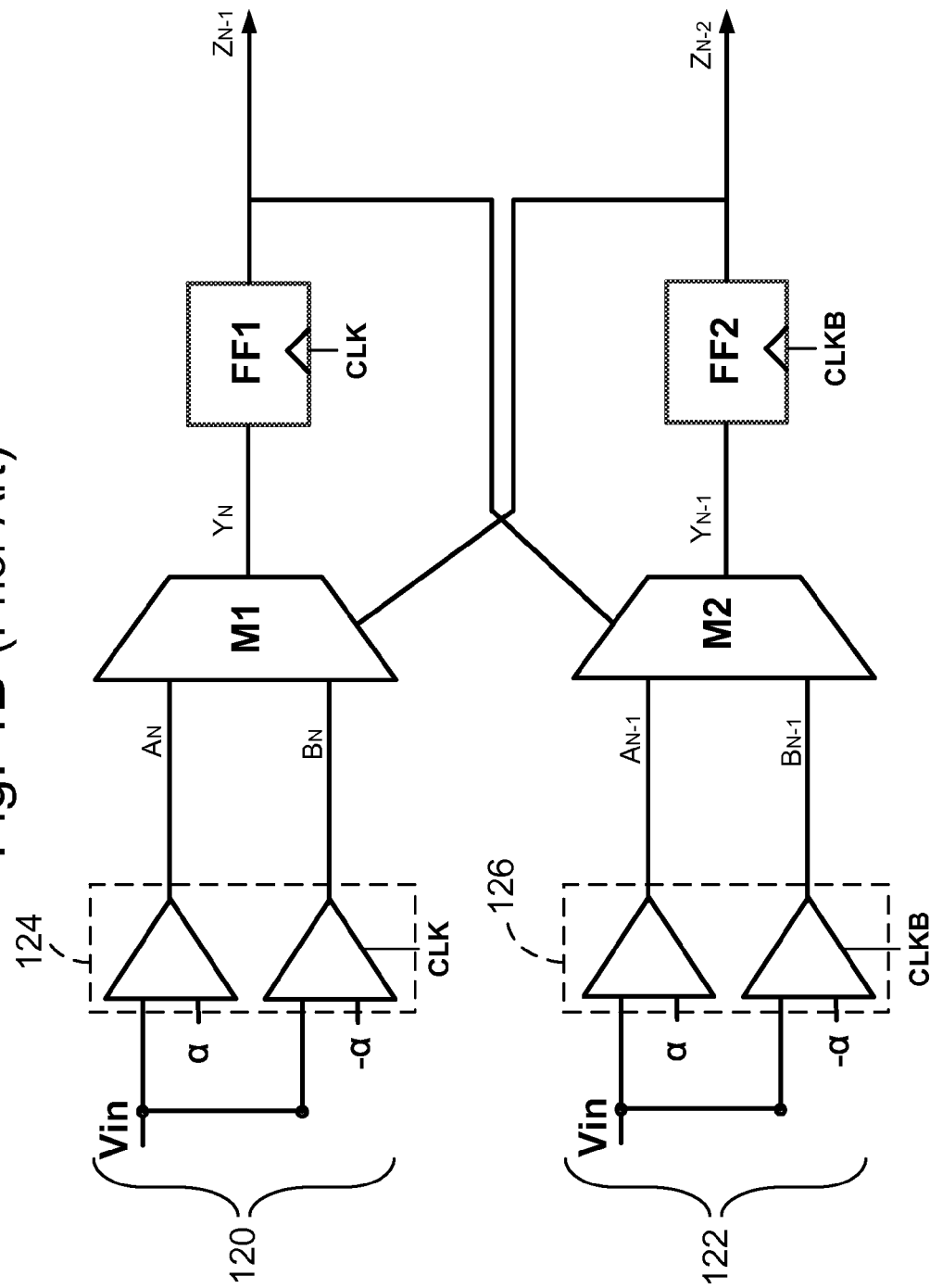
FIG. 1B illustrates a conventional double data rate (DDR) partial response decision feedback equalizer (PrDFE).

Embodiments of a partial response decision feedback equalizer (PrDFE) and related methods are disclosed. In one embodiment, the equalizer includes a receiver with at least first and second comparators to compare an input signal representing a sequence of symbols against respective thresholds and to respectively generate first and second comparator outputs. A first selection stage is provided to select (a) between the first comparator output and a first resolved symbol according to a first timing signal, and (b) between the second comparator output and the first resolved symbol according to the first timing signal, to produce respective first and second selection outputs. The first resolved symbol may be a single bit or a symbol having plural bits. A second selection stage selects between the first and second selection outputs according to a selection signal, and outputs the first or second selection output as the first resolved symbol. The selection signal is dependent on a prior resolved symbol preceding the first resolved symbol. In specific embodiments, the selection stages include multiplexer circuitry that effectively freezes the output of the second selection stage at specific times to prevent glitches. In specific embodiments, the multiplexer circuitry employs a hold state that emulates the function of a latch, but without a latch delay in the critical timing path.

The embodiments presented herein are not limited to specific data rate implementations, e.g., single data rate (SDR) implementations; detail will be presented below for other specific embodiments, including a double data rate (DDR) embodiment, a quad data rate (QDR) embodiment, and embodiments having plural taps. Other implementations are also possible.

In a multi-data rate embodiment (e.g., DDR, QDR, etc), conditional samples are generated in response to respective clock signals having different phases. The conditional samples correspond to different bit intervals. The method further includes selecting, in response to the state of a timing signal, and for each bit interval, either (i) a selective one of the conditional samples for that bit interval, or (ii) a hold state representing the one of the multiple conditional samples just selected. For example, during a first state exhibited by the timing signal, a logic state is selected for a current symbol based on at least one prior data signal, and during a second state exhibited by the timing signal, the state of that symbol is maintained.

Referring now to FIG. 1A, one embodiment of a signaling system, generally designated 100, employs a chip-to-chip architecture enabling high-speed wired communications between a first integrated circuit (IC) 102 and a second IC 104. The first IC employs transmitter circuitry 106 responsive to a first timing signal input 107 to drive data symbols onto a signal link 112. To receive the data symbols, the second IC includes receiver circuitry 108 responsive to a second timing signal input 110 to sample the input data symbols. To enable low-latency decision feedback equalization, particularly to compensate sampling for ISI attributable to a first postcursor symbol, the second IC employs one embodiment of a PrDFE, more fully described below, to compensate for high frequency attenuation due to ISI. FIG. 1A identifies a single link, but in practice, many such links may be utilized, in parallel to each other, or otherwise. Further, while not shown, each IC, or chip, may include transceiver circuits, thus employing both transmitters and receivers at each pin to effect bidirectional communication with the other IC along one or more links. The system may be employed in a variety of applications including, for example, (1) high-speed memory systems where the first IC comprises a memory controller and the second IC comprises a volatile or nonvolatile memory device (such as a DRAM or flash memory chip), or (2) a highly serialized transmission scheme, such as for example in a SERDES implementation such as a system implemented in accordance with PCI Express, SATA, HDMI, USB, or other high speed signaling protocols.

FIG. 1B illustrates a conventional single-tap double data rate (DDR) PrDFE as an example of a circuit subjected to a conventional PrDFE timing constraint. The circuit includes a pair of sampling circuits 124 and 126, each having two samplers. The sampling circuits each feed two alternative (or "conditional") samples to respective multiplexers M1 and M2. Each multiplexer is controlled to select one of the samples provided to it as an output. The outputs are fed to respective latches or flip-flops FF1 and FF2. The outputs of each flip-flop are cross-coupled to the selection or control inputs of the other multiplexer, i.e., the output of FF1, in addition to providing a resolved data symbol ($Z_{N-1}$) is used to control selection for multiplexer M2 and conversely, the output of FF2, in addition to provide a resolved data symbol ($Z_{N-2}$) is used to control selection for multiplexer M1. Thus, the data selection by one multiplexer is based on a resolved data output from the flip-flop output from the other path. This cross-coupling forms a critical timing path governed by a timing constraint where the sum of the multiplexer and latch delays must be less than a single unit interval (UI) (which is equal to the time between consecutive transmitted data symbols). This is a difficult timing constraint to satisfy with for very fast signaling rates, i.e., the signaling rate used can typically be no more than 1/UI, with UI>$t_{ck-Q}$ $t_{sel}$, where $t_{ck-Q}$ is the clock-to-output delay of the flip-flop, either FF1 or FF2, and $t_{sel}$ is the delay associated with controlling the ensuing multiplexer M1 or M2. In very high speed signaling systems, such a flip-flop or a latch is frequently used to prevent a possible "race condition," e.g., where the selection YN could otherwise be affected by fast propagation to affect selection of multiplexer M2 while FF2 is resolving $Z_{N-2}$.

Embodiments described below provide an architecture where the timing constraint is nevertheless reduced to $t_{sel}$<1UI, meaning that these embodiments can be used with a faster signaling rate (i.e., a smaller UI), all while avoiding race conditions.

Figure 2:
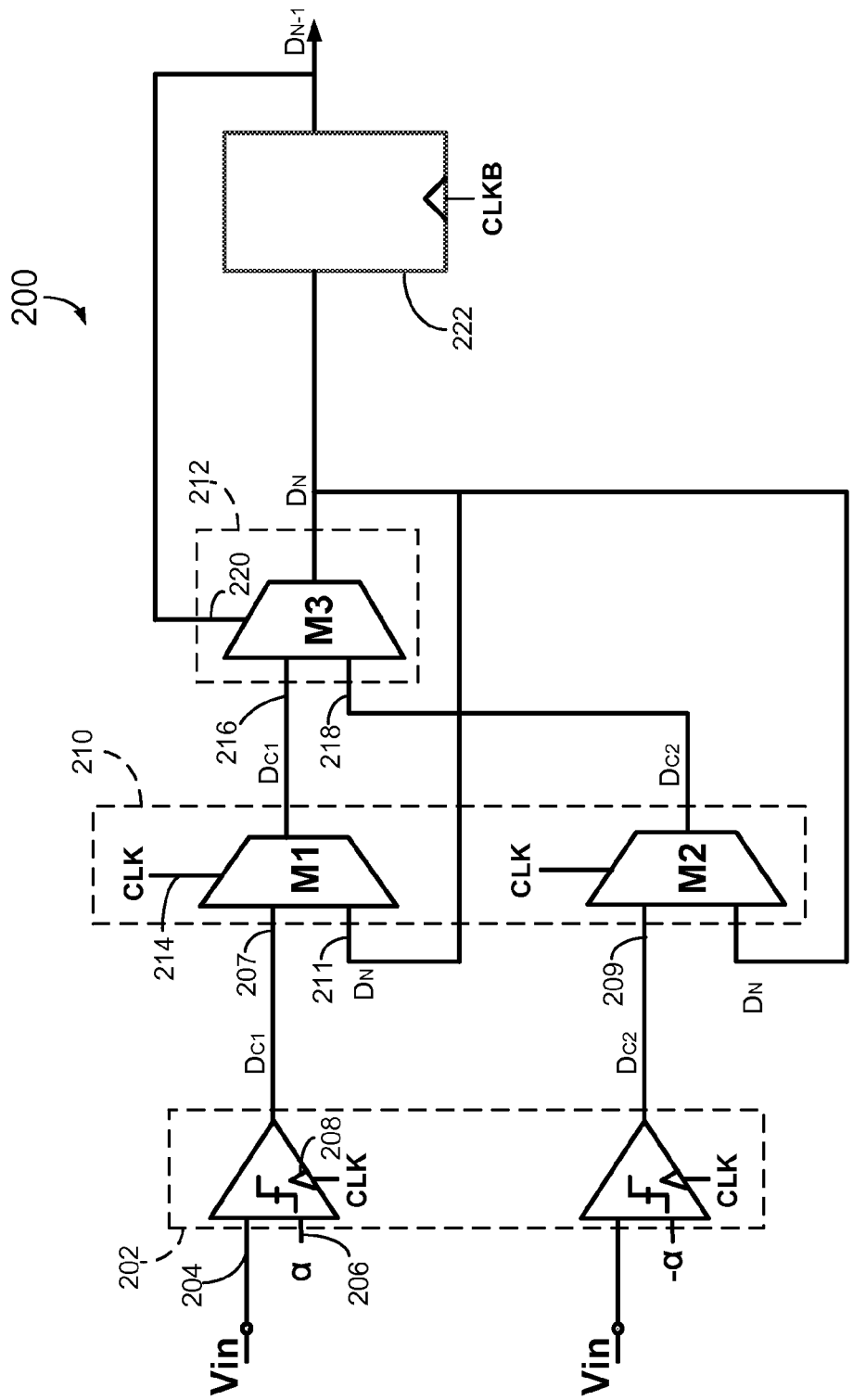
FIG. 2 illustrates one embodiment of a PrDFE having a single tap for operation at a single-data-rate (SDR).

FIG. 2 illustrates one embodiment of a PrDFE in the form of a single-tap single-data-rate (SDR) circuit, generally designated 200. The "tap" label generally refers to the degree of prior data dependency for each output value. For instance, "single-tap" typically refers to adjusting an output value based on a single prior data value, while "multi-tap" often refers to adjusting the output value based on multiple prior data values. The PrDFE includes a receiver circuit 202 having M comparators or samplers. Each sampler includes a data input 204 to receive a data signal Vin and a reference input 206 to receive a reference voltage commonly referred to as partial response threshold. The partial response threshold generally corresponds to a negative or positive offset ($-\alpha$, $+\alpha$) with respect to the common mode value of the received data signal. Each offset represents the amount of partial response compensation to apply to a given input signal based on the state of a prior symbol, thereby cancelling or eliminating ISI. Each sampler further includes a timing input 208 responsive to a sampling clock CLK. As disclosed in additional embodiments below, the M samplers may be N-way parallelized to support multi-phase embodiments.

Further referring to FIG. 2, the receiver circuit 202 generates multiple sampler output signals that, in one embodiment, are fed as conditional samples $D_{C1}$ and $D_{C2}$ to the respective inputs 207 and 209 of a first set or stage 210 of 2:1 multiplexers M1 and M2. Each of the multiplexers M1 and M2 also receive a second input signal $D_N$, at 211, fed back from a data output of a second or subsequent multiplexer stage 212. A control input 214 provided for both of the multiplexers M1 and M2 receives the clock signal CLK that, as more fully described below, enables the two stages of multiplexers 210 and 212 to selectively exhibit a hold state, to produce a stream of resolved data symbols in a consecutive and cyclic manner.

With continued reference to FIG. 2, the second multiplexer stage includes a set of inputs 216 and 218 corresponding to the number of samplers and the number of multiplexers in the first stage of multiplexers. Each input receives a conditional sample (e.g., $D_{C1}$ and $D_{C2}$) from a multiplexer in the first stage 210. A control input 220 for the second stage of multiplexers 212 receives a data value from a previously resolved data symbol (e.g., data bit $D_{N-1}$). This value thus provides the selection between the multiple inputs to select a single resolved data symbol (e.g., data bit $D_N$) for provision to latch 222. The resolved data symbol is fed back as an input in parallel to each multiplexer M1 and M2 in the first stage of multiplexers 210. Further, the falling edge of the clock CLK used for first stage selection causes each multiplexer M1 and M2 to effectively freeze the resolved data bit output while the first stage multiplexer selection signal is low, which helps lock out a race condition.

In one embodiment, the timing reference to the first stage of multiplexers 210 and the timing reference to the latch 222 can be delayed with respect to the sampling clock for the samplers, such that multiplexers M1 and M2 select the respective conditional samples ($D_{C1}$ and $D_{C1}$) exactly when these signals become available. In this manner, the multiplexer and latch clocks are delayed with respect to the sampling clock by the clock-to-Q delay of the sampler. In other embodiments, the latch timing reference may be further or differently delayed with respect to the multiplexer timing references.

In a further embodiment that speeds up the settling time of the data $D_N$ on the feedback path 211, an additional multiplexer may be employed in the circuit of FIG. 2. The additional multiplexer would be disposed in parallel with multiplexer M3 and act as an unloaded "replica." The replica multiplexer would not have an output driving the latch 222, and thus produces a settled output for the data signal $D_N$ faster than multiplexer M3 on its own.

Figure 3:
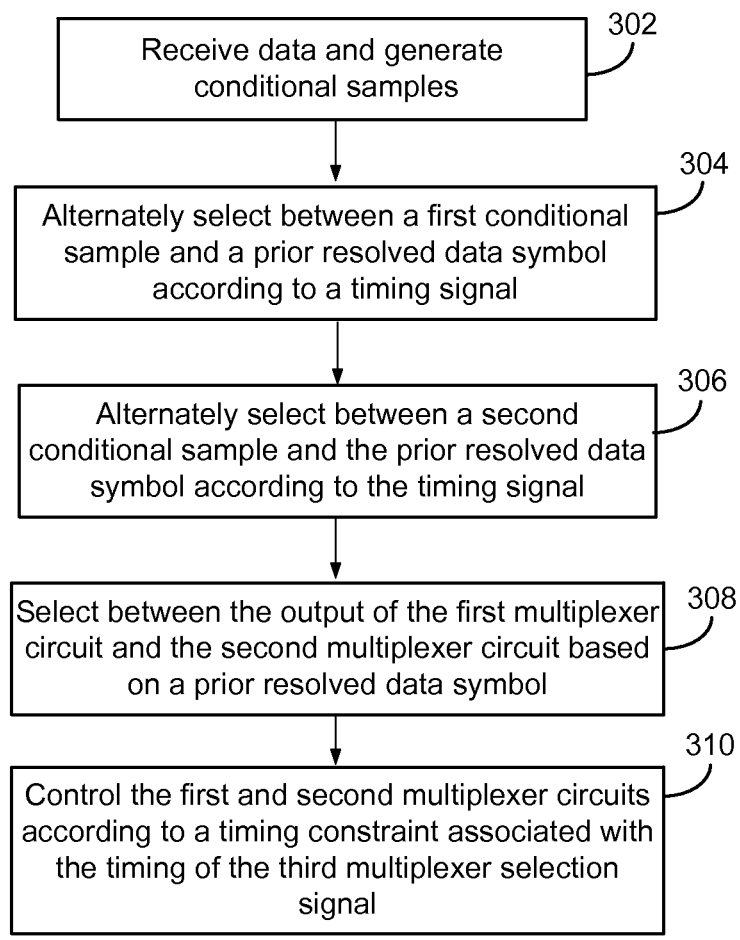
FIG. 3 illustrates one embodiment of a method involving the PrDFE of FIG. 2.

FIG. 3 illustrates a method involving the PrDFE of FIG. 2. Data symbols are received by the M samplers to generate conditional samples, at step 302. At steps 304 and 306, the multiplexers in the first stage each select between a respective conditional sample and a fed-back copy of the second stage multiplexer output (i.e., the resolved data symbol for that sample path) according to the state of the control input timing signal. The second stage of multiplexer circuitry then selects from the outputs of the first stage based on a previously resolved data symbol, at step 308.

Assuming that the conditional samples are gated by a positive-going portion of the clock signal CLK, and the resolved data (from the second multiplexer stage) is then frozen by the negative-going portion of the clock signal, the first stage multiplexer output will not change during the negative-going interval of the clock. In effect, the selection logic, including each stage of multiplexers, is inhibited from changing state during each of the "negative" clock intervals, at step 310. This helps prevent a race condition, where the resolved data bit output might potentially change before the resolved data symbol is properly fed back for selection purposes. By implementing the hold state according to a predefined timing constraint with the multiplexer circuitry, the need for a flip-flop or other form of latch in the control loop to control a possible race condition is avoided. In turn, this helps reduce delays in the critical timing path, enabling the illustrated circuitry to be operated with relative faster signaling rates.

Figure 4:
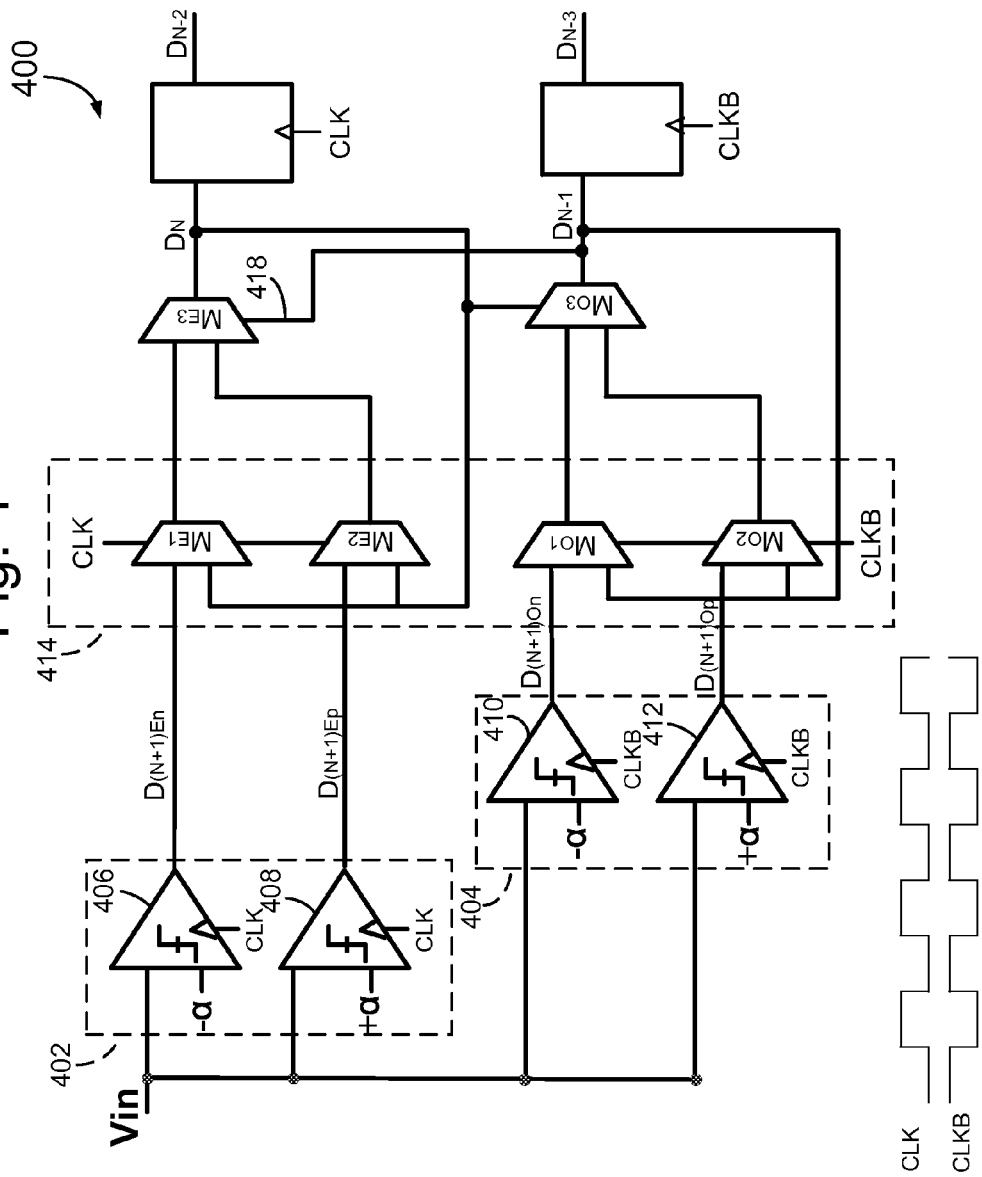
FIG. 4 illustrates one embodiment of a single-tap double-data rate (DDR) PrDFE.

FIG. 4 illustrates one embodiment of a multi-phase PrDFE in the form of a single-tap DDR circuit, generally designated 400. "Multi-phase" refers to transferring multiple bits of data from the input data symbol at a rate higher than the symbol clock rate. Thus, transferring two bits during the symbol clock period (responsive to, for example, respective rising and falling edges of the clock signal) is often termed DDR, while transferring at four-times the clock rate corresponds to quad-data-rate (QDR), and so on.

With continued reference to FIG. 4, the PrDFE 400 employs receiver circuits 402 and 404 (both in phantom, each having multiple comparators or samplers) to receive and sample an input signal Vin in response to respective clock signals CLK and CLKB. The clock CLKB is generally a complementary version of the clock CLK, such that the two are offset in phase by 180 degrees.

The first receiver circuit 402 includes a pair of comparators 406, 408 having clock inputs based on CLK and respective data inputs to receive data symbols (as part of the input signal, Vin). Each comparator also includes a "partial-response" threshold input ($-\alpha$ and $+\alpha$, respectively). The comparators 406, 408 generate "negative" and "positive" output sample values, respectively, based upon the comparison between the sampled input data symbol and the partial response values $-\alpha$ and $+\alpha$. Note that the use of the terms "positive" and "negative" refers to nomenclature only, and not actual signal characteristics. The sample set generated using CLK is referred to herein as an "even" set of samples, and is temporarily stored in a pair of unclocked RS latches (not shown) that follow the comparators 406 and 408, respectively, and form part of the receiver circuit 402. As will be more evident in the description below, deferring the interpretation of multiple "conditional" samples provides the PrDFE with more time to base symbol interpretation on ISI associated with a prior symbol (by providing delays sufficient to permit resolution of the prior symbol).

The second receiver circuit 404 also includes a pair of comparators 410, 412 similar to those of the first receiver circuit 402, but clocked at a different clock phase dependent on CLKB. This results in a set of "odd" samples, with negative and positive sample values based respectively on the respective comparisons to the partial response thresholds $-\alpha$ and $+\alpha$. The odd samples are stored by RS latches (not shown) for output as a second set of conditional samples.

Throughout the disclosure herein, multiple forms of storage elements (such as SR flip flops, D flip-flops, latches, and the like) may be specified for different embodiments. For purposes of clarity, edge-triggered storage elements are shown in the Figures with corresponding clock inputs. Storage elements clocked by a common clock edge, or within the same timing domain, are referred to herein as a storage stage.

The first set of conditional samples comprises a negative, even sample $D_{(N+1)En}$ (resulting from comparison to the $-\alpha$ threshold, where N+1 denotes a conditional sample for data bit N+1) and an even, positive sample $D_{(N+1)Ep}$ (resulting from comparison to the $+\alpha$ partial response threshold). A similar naming convention and path designation applies to each of the odd samples $D_{(N+1)On}$ (odd, negative sample) and $D_{(N+1)Op}$ (odd, positive sample).

With continued reference to FIG. 4, the PrDFE 400 reduces delays in the critical timing path by employing multiplexer circuitry with no storage element circuitry in the feedback loop. The multiplexer circuitry selectively employs a hold state to ensure that the resolved data output bit does not change before it is expected to pass a subsequent data bit. The use of a timing signal as a selection or control input to multiplexer circuitry and the feedback of the output of the multiplexer circuitry are used to implement this hold state. This enables a PrDFE timing constraint based solely on multiplexer delays.

Further referring to FIG. 4, the receiver circuits 402 and 404 feed a first stage 414 of multiplexers. This first stage includes sets of even and odd pairs of multiplexers $M_{E1}$, $M_{E2}$ and $M_{O1}$, $M_{O2}$ disposed in respective even and odd conditional sample paths. Each multiplexer in the even path includes a first input to receive a conditional sample value from one of the even samplers and a second input to receive the previous resolved output $D_N$ from the even path. The control inputs for the first stage of even multiplexers $M_{E1}$ and $M_{E2}$ are driven by a timing signal such as a clock CLK to hold the state of the even path. The outputs from the first stage 414 of multiplexers are fed to a subsequent "second stage" multiplexer $M_{E3}$. The multiplexer $M_{E3}$ includes a control input 418 that causes the multiplexer to select between the two even conditional samples based upon a prior resolved data bit $D_{N-1}$, which is obtained from an output of the odd sample path. This configuration forms half of a control loop for determining the eventual output data based on prior data.

Further referring to FIG. 4, the second half or "odd path" of the control loop also includes a pair of first stage multiplexers $M_{O1}$ and $M_{O2}$. These multiplexers have inputs that receive (1) the set of conditional samples $D_{(N+1)O}$ and $D_{(P+1)O}$, and (2) the immediately previous resolved data bit from the odd path, $D_{N-1}$. The control inputs to these multiplexers are also both tied to a clock signal, in this case, CLKB (which is 180 degrees out of phase with CLK). The "second stage" multiplexer $M_{O3}$ for the odd sample path then selects one of the conditional odd samples based on a prior resolved data bit $D_N$ obtained from the even sample path, i.e., the immediately previous bit output from "second stage" multiplexer $M_{E3}$.

Note that the round-trip path from the output of multiplexer $M_{O3}$ to selection of multiplexer $M_{E3}$ and from the output of $M_{E3}$ to the selection of multiplexer $M_{O3}$ provides for directly cross-coupled multiplexers, providing a timing constraint of $1UI > t_{sel}$, which enables a faster signaling rate to be used than many conventional high-speed designs. The state of the resolved bits are inhibited from changing prematurely (due to, for example, cross-coupled multiplexer race conditions) through use of the out-of-loop timing signals CLK and CLKB, which as mentioned, help create the "hold state."

While the PrDFE of FIG. 4 lends itself well to DDR applications, similar design techniques can also be applied to an N-phase PrDFE having one or more taps. As will be described in relation to further embodiments below, this may be accomplished in a straightforward manner.

As was the case earlier, a variation in the system of FIG. 4 permits the timing references to the first stage of multiplexers 414 and the timing references to the latches to be delayed with respect to the (respective) sampling clocks for the samplers/comparators (406,408,410,412), such that multiplexers $M_{E1}$, $M_{E2}$, $M_{O1}$ and $M_{O2}$ select the respective conditional samples ($D_{(N+1)En}$, $D_{(N+1)Ep}$, $D_{(N+1)On}$ and $D_{(N+1)Op}$) exactly when these signals become available. In this manner, the multiplexer and latch clocks are delayed with respect to the sampling clock by the clock-to-Q delay of the sampler; a delay may be calculated in common for both sample paths (e.g., an average delay), or independent delays per sample path may be used.

Figure 5:
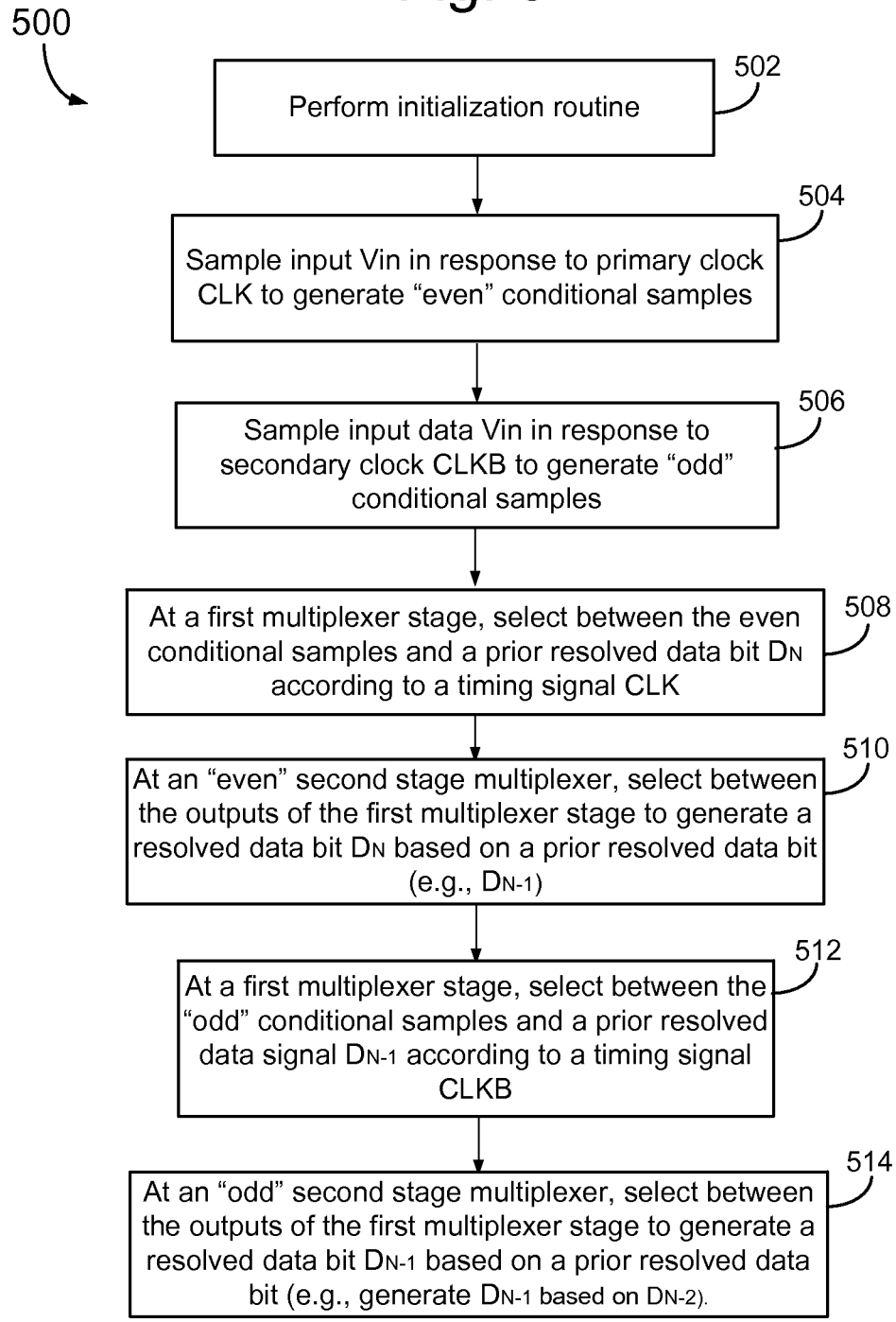
FIG. 5 illustrates one embodiment of a method involving the PrDFE of FIG. 4.

FIG. 5 illustrates a block diagram setting forth a high-level method of operation, generally designated 500. The PrDFE first undergoes an initialization routine, at step 502; this initialization routine can be selected to drive a specific bit pattern on each lane, to train the PrDFE for purposes of seeding proper decision thresholds that will be used in live data operations. With initial operation stabilized, the method continues, at 504, by sampling the input signal Vin, with the first receiver circuit, in response to the primary clock signal CLK; this generates "even" conditional samples. At 506, the second receiver circuit receives and samples Vin a half-cycle later, in response to the secondary clock signal CLKB, thereby generating "odd" conditional samples. The first multiplexer stage receives the "even" conditional samples, and at 508, selects between the "even" conditional samples and a prior resolved data bit $D_N$ according to the timing signal CLK.

The selection between the "even" conditional samples and the prior resolved data bit $D_N$ according to the timing single CLK provides a way for the multiplexer circuitry to exhibit a "hold" state without the need for flip-flops in the control loop path. For rising edges of the clock CLK, the even conditional samples are passed through to the "even" multiplexer for the second stage of multiplexers. At 510, the second multiplexer stage selects between the "even" conditional samples to generate a resolved data bit $D_N$. Each resolved data bit output is then held for a full cycle of CLK.

Further referring to FIG. 5, at 512, the "odd" multiplexers of the first multiplexer stage select between the "odd" conditional samples and a prior resolved data bit $D_{N-1}$ according to the CLKB, which is 180 degrees out of phase with CLK. Similar to the even path description above, at the "odd" multiplexer of ($M_{O3}$) of the second stage of multiplexers, a selection is made between the odd conditional samples from the first multiplexer stage ($M_{O1}$ and $M_{O2}$) to generate the resolved data bit $D_{N-1}$; this is indicated by numeral 514.

The method described above provides a sample output selected from competing possibilities based on the least latent previous data value. This provides a resolved data bit far less susceptible to the effects of ISI. Further, by implementing a hold state with the multi-stage multiplexer circuitry, timing delays due to flip-flops or latches in the critical timing path may be avoided.

Figure 6:
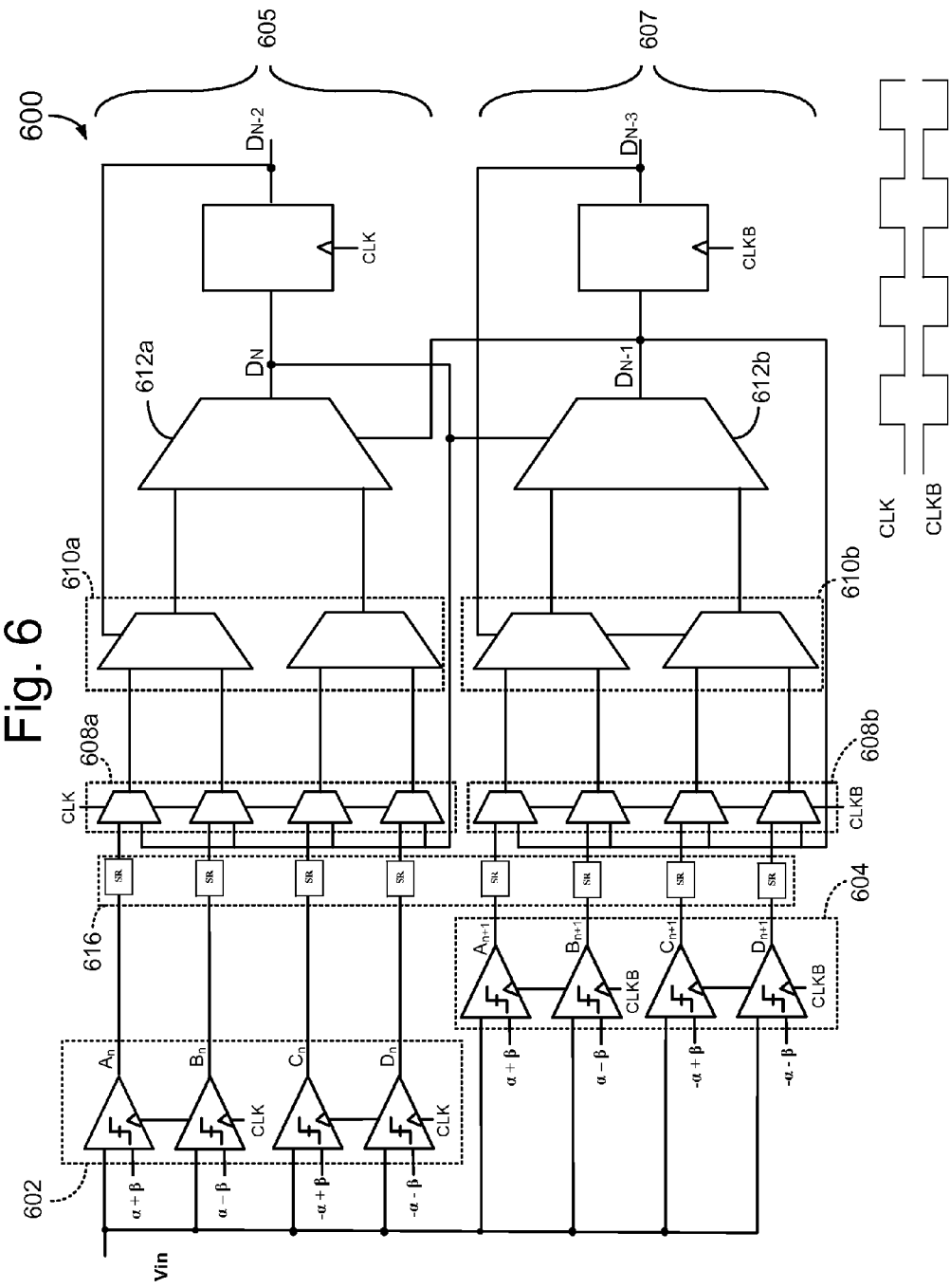
FIG. 6 illustrates one embodiment of a multi-tap DDR PrDFE.

Referring now to FIG. 6, one embodiment of a multi-tap DDR PrDFE, generally designated 600, employs many of the same features described for prior embodiments. Resolved data bits $D_N$ and $D_{N-1}$ are generated based on feedback from previous data bits $D_{N-3}$ and $D_{N-2}$, respectively. Generally, for an N-tap configuration, $2^N$ different partial response thresholds are typically employed for the respective receiver circuits (i.e., used for purposes of comparison as has been described above). Thus, to support 2-taps, four partial response values ($\alpha+\beta$), ($\alpha-\beta$), ($-\alpha+\beta$), and ($-\alpha-\beta$) are used as comparator inputs for a first receiver circuit 602. The partial response thresholds represent ISI attributable to the two preceding bits of the input signal Vin representing patterns 00, 01, 10, 11, respectively. Each of four comparators in the first receiver circuit compares its partial response value to Vin in response to a first clock CLK. The output of the comparators, An, Bn, Cn and Dn represent "even" conditional samples. A second receiver circuit 604 generates "odd" conditional samples in response to a second clock CLKB (having the same frequency as the first clock CLK, but separated from CLK by 180 degrees of phase). The two receiver circuits (responsive to the two clocks) define a double-data-rate configuration with respective even and odd conditional sample paths 605 and 607.

Further referring to FIG. 6, three stages of selection logic 608a/b, 610a/b, and 612a/b are employed along the even and odd conditional sample paths 605 and 607 to select or pass one sample from among the four "conditional samples" produced by each receiver circuit. In one embodiment, the first stage of selection logic 608a/608b comprises two arrays of multiplexers, each array having four 2:1 multiplexers, with each multiplexer with a control input tied to CLK or CLKB as appropriate. Since the signals CLK and CLKB are generated outside the DFE control loop, they are not dependent on results fed back from a downstream output in the circuit. Each 2:1 multiplexer in first stage multiplexer set 608a selects between a conditional sample from the first receiver circuit 602 and a prior resolved data bit $D_N$ from the output of a multiplexer 612a in a third stage of selection logic. Similarly, each 2:1 multiplexer in first stage multiplexer set 608b selects between a conditional sample from the second receiver circuit 604 and a prior resolved data bit $D_{N-1}$ from the output of a multiplexer 612b in the third stage of selection logic. The second stage of selection logic 608a/b processes the even/odd samples in response to the signals CLK/CLKB, respectively. The second stage of selection logic 610a/b features two sets of two 2:1 multiplexers, each set to receive four samples from the first stage as inputs. As depicted, each set of multiplexers has a selection input controlled in response to prior resolved data bits $D_{N-2}$ and $D_{N-3}$, respectively. The last stage of selection logic (i.e., seen as including multiplexer 612a/b) generates data bits $D_N$ and $D_{N-1}$ based on prior resolved data bits $D_{N-1}$ and $D_N$, respectively.

As before, a variation to the system of FIG. 6 permits the timing reference to the first stage of multiplexers 616 and the timing reference to the latches (seen at the right of FIG. 6) to be delayed with respect to the (respective) sampling clocks used by the receivers 602 and 604. In this manner, multiplexers 610a/610b can be controlled to select the respective conditional samples ($A_n$, $B_n$, $C_n$, $A_{n+1}$, $B_{n+1}$, $C_{n+1}$ and $D_{n+1}$) exactly when these signals become available, offsetting the multiplexer and latch clocks with respect to the sampling clock by the clock-to-Q delay of the sampler. Once again, this may be done for each sample path independently, or by applying a common or average delay to multiple sample paths.

The multi-tap DDR embodiment described above operates similarly to the single-tap DDR embodiment, but includes at least one extra stage of selection logic (e.g., multiplexers) to select and resolve data outputs from twice the number of conditional samples. As can be seen from the description of the multi-tap DDR embodiment, the principles herein are readily applicable and scalable to N parallel paths that correspond to N taps.

Figure 7:
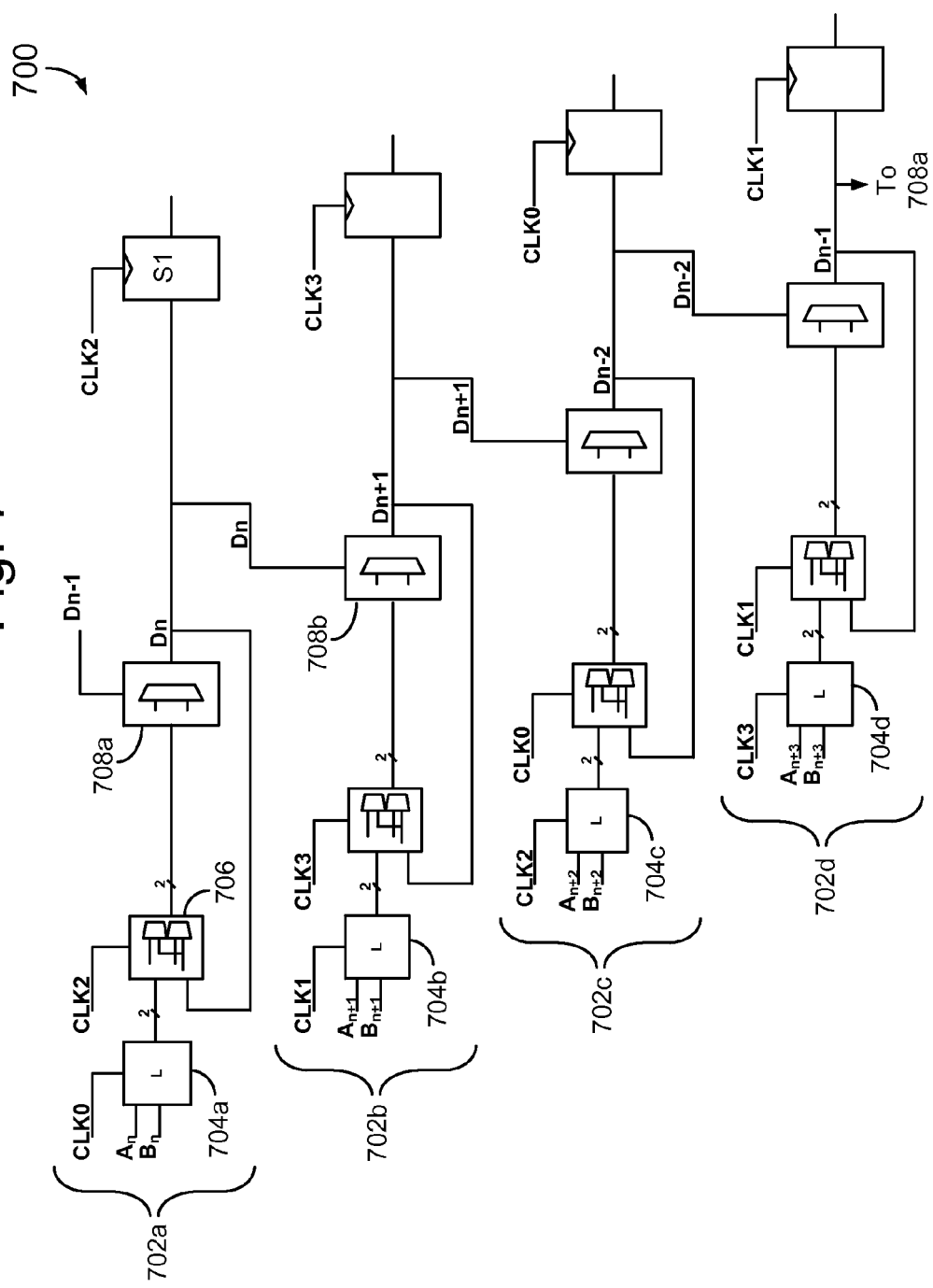
FIG. 7 illustrates one embodiment of a single-tap QDR PrDFE.
Figure 8:
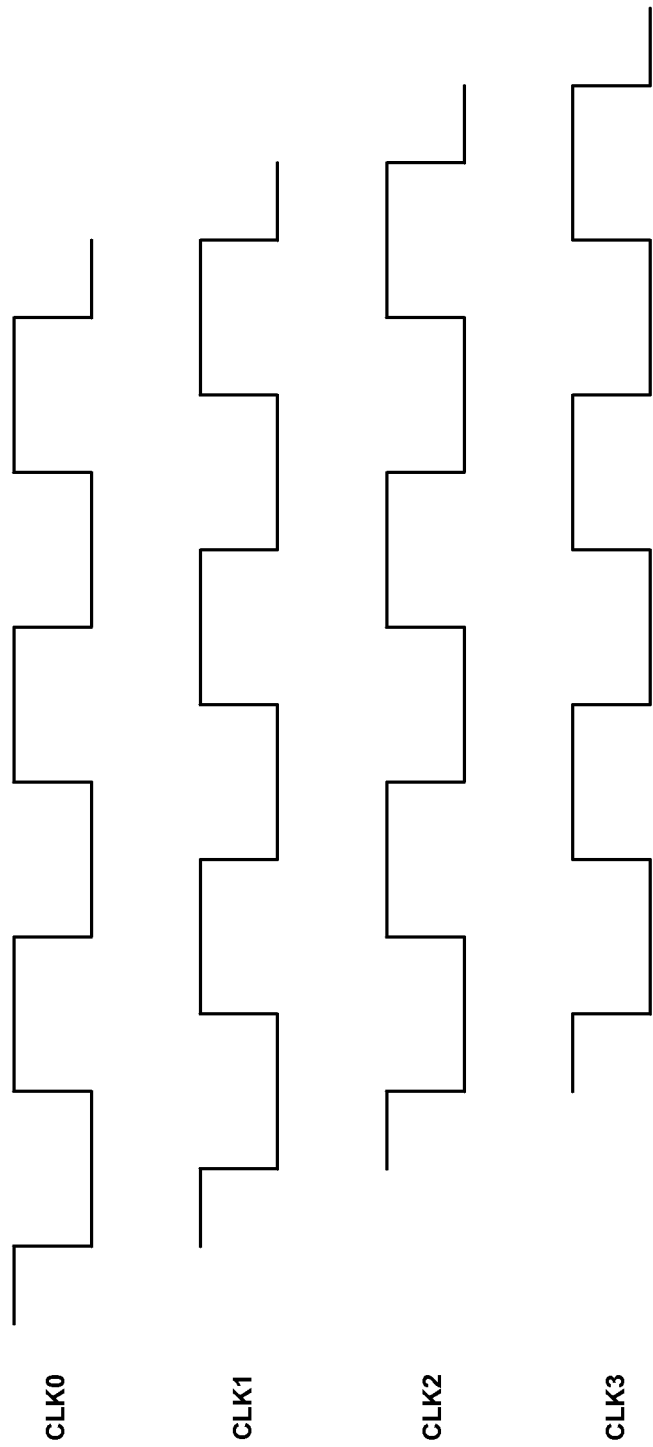
FIG. 8 illustrates the clock timing involved in the PrDFE of FIGS. 7 and 9.

FIG. 7 provides a further embodiment of a PrDFE 700 with multiplexer circuitry having a hold state, in this case for a single-tap quad-data-rate (QDR) system. The QDR system employs four parallel decisional circuits 702a-d for processing conditional samples $A_n$, $B_n$ through $A_{n+3}$, $B_{n+3}$ These conditional samples are generated by multiple receiver circuits (not shown) and are latched into SR latches 704a-d. The SR latches respond to the leading edges of respective clocks CLK0, CLK1, CLK2 and CLK3. Each of the clocks is evenly spaced apart in quadrature (90 degrees of phase difference), and each is of a common frequency (i.e., twice the periodic system clock frequency). The timing relationship between the various clocks is shown in FIG. 8.

Further referring to FIG. 7, each decisional circuit 702a-d further includes selection logic that employs a "hold state" to selectively inhibit the changing of resolved data bits in accordance with a predefined timing constraint. For purposes of clarity, the selection logic associated with only one parallel decisional circuit (702a) will be described in detail, with the understanding that all of the decisional circuits include similarly structured selection logic. In one embodiment, the selection logic includes a first stage of multiplexers 706 that receives conditional samples An and Bn from the latch 704a. Each of the multiplexers in the first stage includes a first input to receive a conditional sample from a corresponding sampler in the receiver circuit, and a second input to receive a prior resolved data bit $D_N$. A control input for each of the first stage multiplexers receives a timing signal CLK2 that is out of phase with the latch timing signal CLK0 by 180 degrees. The control input is set in accordance with a predefined timing constraint more fully set forth below.

With continuing reference to FIG. 7, the first stage of multiplexers 706 feeds its output to a second stage of multiplexers 708a. The second stage of multiplexers 708a includes inputs to receive the conditional samples for the specific decisional circuit. A control input for the second stage of multiplexers receives a prior resolved data bit $D_{N-1}$ e.g., a data bit which immediately precedes data bit $D_N$. In turn, the resolved data bit $D_N$ that will be produced from the first decisional circuit 702a is fed to the second decisional circuit 702b for use as the control input for the second stage of multiplexers 708b of that decisional circuit. The resolved data bit $D_N$ is also fed to a storage element S1 and latched in response to the clock signal CLK2. The other parallel decisional circuits are formed similarly, with the resolved outputs for each decisional circuit fed to the next adjacent decisional circuit as the control input for the second stage of multiplexers. Thus, the state of the resolved data bit $D_N$ is used for resolving the conditional samples to select data bit $D_{N+1}$, and the state of the resolved data bit $D_{N+1}$ is used for resolving the conditional samples to select data bit $D_{N+2}$, and so forth.

In operation, conditional samples are generated every 4UI and passed to the first stage of multiplexers. Changes in state to the output of the resolved data bit for sample path 702a are selectively inhibited by the control input to the first stage. That is, the timing constraint placed on the timing signal CLK2 fed to the control input to the first multiplexer stage 706 for the first decisional circuit 702a (and also for the other decisional circuits via CLK3, CLK0 and CLK1, respectively) is such that the resolved data bit for each path cannot change faster than every four UI. Similar to prior embodiments, conditional samples are passed to the second stage of multiplexers when the corresponding control input is high, and the state of the output of the second stage of multiplexers is is held when the control input clock is low. Since neither these outputs nor the associated multiplexer control input changes when the corresponding control clock is low, there is no change to the output of the second stage of multiplexers 708.

Figure 9:
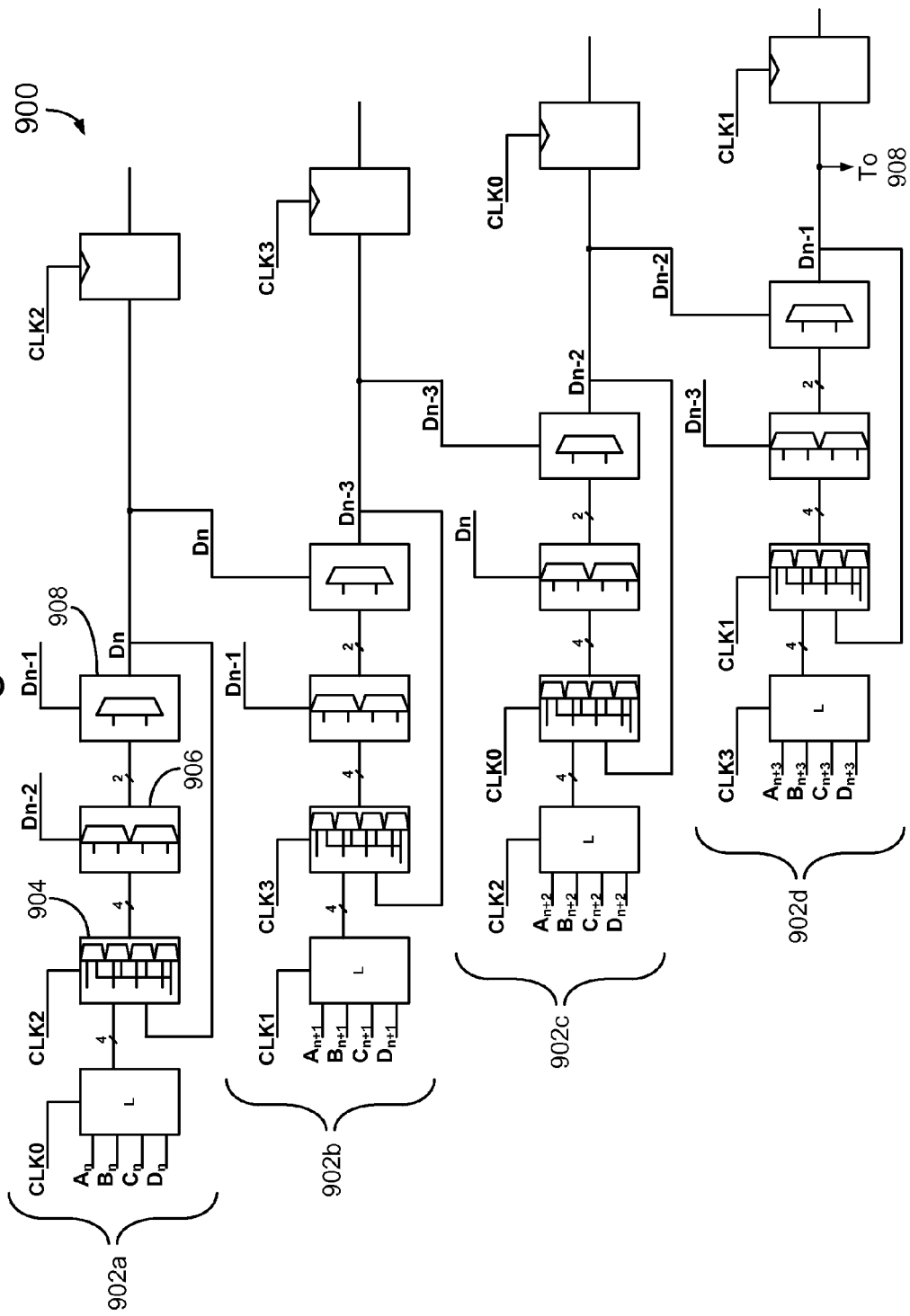
FIG. 9 illustrates an embodiment of a multi-tap QDR PrDFE.

FIG. 9 illustrates an embodiment of a multi-tap QDR PrDFE, generally designated 900, that employs two taps. The overall architecture is similar to the single-tap QDR embodiment of FIG. 7, with four conditional sample paths 902ad having a quadrature relationship with each other, but having twice the number of conditional samples involved in the output resolving process due to double the number of tap reference voltages (not shown). Like the single-tap architecture, each of the sample paths for the multi-tap architecture includes a first stage of multiplexers 904 and one or more additional stages of multiplexers; in this case, there are second and third stages of multiplexers, 906 and 908, respectively. That is, as a result of the extra conditional samples, an additional multiplexer stage 908 is employed such that a single resolved output data bit is selected from the four conditional samples. The control input CLK2 to the first stage of multiplexers 904 is a timing signal that, in one embodiment, is 180 degrees out of phase with the sampling clock CLK0. The second and third multiplexer stages 906 and 908 have control inputs that are based on prior resolved data bits $D_{N-2}$ and $D_{N-1}$ from other conditional sample paths. With the control input for the first stage being outside the critical timing path loop, and thus independent of any prior resolved data bits, a hold state similar to that described previously may be realized.

The previous described embodiments generally show two-level signaling schemes that carry signals at one of two signal levels (i.e. at either a logic zero level or a logic one level). Such systems are often referred to as 2-PAM to denote pulse amplitude modulation at the two signal levels. The features described herein may also be employed in 4-PAM (Pulse Amplitude Modulated) PrDFE, or higher, employing many of the features described in the previous embodiments, but where four or more levels are employed resulting in multiple data eyes during a given unit interval UI. In such an implementation, a hold state is used, as was described above, to maintain the state of (2-bit) resolved data symbols.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit comprising:
    a receiver including at least first and second comparators operable to compare an input signal representing a sequence of symbols against respective partial response thresholds and to respectively generate first and second comparator outputs;
    selection circuitry operable to (a) select between the first comparator output and a first resolved symbol according to a first timing signal, (b) select between the second comparator output and the first resolved symbol according to the first timing signal, to produce respective first and second selection outputs, and (c) select between the first and second selection outputs according to a selection signal and to output the first or second selection output as the first resolved symbol;
    wherein the selection signal is dependent on a prior resolved symbol that precedes the first resolved symbol in the sequence of symbols.

2. The integrated circuit according to claim 1 wherein the first timing signal is independent of any prior resolved symbols.

3. The integrated circuit according to claim 2 wherein the selection circuitry comprises first and second selection stages, and wherein the second selection stage exhibits a hold state based on a state of the first timing signal.

4. The integrated circuit according to claim 3 wherein the first timing signal comprises a first clock signal.

5. The integrated circuit according to claim 4 wherein the receiver samples according to the first clock signal.

6. The integrated circuit according to claim 1 wherein the respective thresholds each represent a level of partial response compensation to apply based on a respective state of a prior symbol.

7. An integrated circuit comprising:
    receiver circuitry operable to receive data and to generate one or more sets of samples at corresponding sampler outputs in response to one or more clock signals;
    selection circuitry operable to (a) alternately select between a first sampler circuit output and a prior resolved data signal according to a first timing signal, the selection comprising a first output, (b) alternately select between a second sampler circuit output and the prior resolved data signal according to the first timing signal, the selection comprising a second output, (c) select between the first and second output to generate a third output that represents a signal with a given state responsive to a selection signal; and wherein the selections for (a) and (b) are constrained to both select the prior resolved data signal before the third output changes state.

8. The integrated circuit of claim 7 wherein the receiver circuitry includes:
comparator circuitry having a data input and a threshold input, the threshold input representing a level of partial response compensation to apply to a given output signal based on the state of a prior data value.

9. The integrated circuit of claim 8 wherein the input signal corresponds to a single data rate, and where the integrated circuit further comprises:
a latch operable to receive the third output and to output the prior resolved data signal; and
a feedback path operable to provide the prior resolved data signal as the selection signal.

10. The integrated circuit of claim 7 wherein the receiver circuitry generates first and second sets of samples at a double data rate in response to first and second clock signals having different phases, the receiver circuitry comprising:
first and second pairs of comparators, each comparator having a first input to receive the data and a second input to receive one of a positive or negative partial response threshold value for comparison to the received data, each comparator to generate a respective conditional sample based on the comparison, the respective conditional samples forming one set of the one or more sets of samples.

11. The integrated circuit of claim 7 wherein the timing signal is generated by a clock circuit and comprises a clock signal, the selection circuitry controlled to select the first and second sampler circuit outputs when the clock signal is in a first state, and controlled to select the prior resolved data signal when the clock signal is in a second state.

12. The integrated circuit of claim 11 wherein the selection signal is generated as an output from a storage circuit, the selection signal comprising a second prior resolved data signal.

13. The integrated circuit of claim 7 wherein the receiver circuitry comprises:
four pairs of comparators operable to sample the data at a quad-data-rate to generate four sets of samples in response to respective clock signals having different phases.

14. A method of operation in a receiver integrated circuit, the method comprising:
receiving data with a receiver including first and second comparators;
generating one or more sets of samples with the first and second comparators from the received data at corresponding sampler outputs in response to one or more clock signals;
(a) alternately selecting, with selection circuitry, between a first sampler circuit output and a prior resolved data signal according to a first timing signal, the selection comprising a first output;
(b) alternately selecting, with the selection circuitry, between a second sampler circuit output and the prior resolved data signal according to the first timing signal, the selection comprising a second output;
(c) selecting, with the selection circuitry, between the first and second output to generate a third output that represents a signal with a given state responsive to a selection signal; and
constraining the selections for (a) and (b) to both select the prior resolved data signal before the third output changes state.

15. The method according to claim 14 and further comprising:
providing the first timing signal independently from any prior resolved symbols.

16. The method according to claim 14 wherein the alternately selecting according to the first timing signal in (a) and (b) comprises:
holding the given state of the third output based on a state of the first timing signal.

17. The method according to claim 16 wherein the received data comprises a sequence of symbols, and the selection signal is dependent on a prior resolved symbol that immediately precedes a first resolved symbol in the sequence of symbols.

18. The method according to claim 14 wherein generating one or more sets of samples is carried out at a double data rate in response to respective first and second clocks that are offset by 180 degrees in phase.

19. The method according to claim 14 wherein generating one or more sets of samples is carried out at a quad data rate in response to respective first, second, third and fourth clocks offset by 90 degrees in phase.

20. The method according to claim 14 wherein generating one or more sets of samples comprises:
comparing the received data against multiple threshold values representing respective levels of compensation to apply to a given output signal based on respective states of a prior data symbol.

* * * * *